（12）United States Patent
Iizuka

(10) Patent No.: US 6,472,745 B1
(45) Date of Patent: Oct. 29, 2002

(54) SEMICONDUCTOR DEVICE

(75) Inventor: Hajime Iizuka, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/482,337

(22) Filed: Jan. 14, 2000

(30) Foreign Application Priority Data

Jan. 18, 1999 (JP) .......................................... 11-008584

(51) Int. Cl.[7] .............................................. H01L 23/34
(52) U.S. Cl. ...................................................... 257/723
(58) Field of Search .................. 257/701, 777, 257/723, 766

(56) References Cited

U.S. PATENT DOCUMENTS 5,834,844 A  11/1998  Akagawa et al. ........... 257/734

FOREIGN PATENT DOCUMENTS

| EP | 0 734 059 A2 | 9/1996 |
|---|---|---|
| EP | 0 786 808 A1 | 7/1997 |
| EP | 0 853 337 A1 | 7/1998 |
| JP | A-62-269350 | 11/1987 |
| JP | A-1-218051 | 8/1989 |
| JP | 11-40613 | 11/1999 |
| WO | WO 95/14314 | 5/1995 |
| WO | WO 98/50953 | 11/1998 |

OTHER PUBLICATIONS

IBM Technical Disclosure Bulletin, vol. 40, No. 80, Aug. 1997 Chip Column Package Structure.
European Search Report dated Feb. 11, 2002.

Primary Examiner—Roy Potter
(74) Attorney, Agent, or Firm—Pennie & Edmonds LLP

(57) ABSTRACT

A semiconductor device in which a plurality of semiconductor chips are consolidated into one and which is provided with at least a set of rerouting wiring lines formed so as to interconnect electrodes of the respective semiconductor chips, the electrodes having a function which is common to the respective semiconductor chips, the set of rerouting wiring line having a common external connection terminal.

19 Claims, 6 Drawing Sheets

SEMICONDUCTOR DEVICE

BACKGROUND OF THE INVENTION

1. Field of the Invention

The invention relates to a semiconductor device which comprises a plurality of semiconductor chips consolidated into one unit, each semiconductor chip having an insulation film formed on its surface so as to expose electrodes located on the surface, and a rerouting wiring pattern formed on the insulation film to be connected to the electrodes, portions of the rerouting wiring pattern being designed to be capable of being connected to an external connecting terminal.

2. Description of the Related Art

Recently, with high-density mounting and the integration of LSIs, miniaturization of semiconductor chips is advancing. In a semiconductor wafer process forming transistors and wiring lines on a semiconductor wafer, since the smaller a semiconductor chip, the larger the number of chips can be obtained from one wafer, production cost can be reduced. However, since, even though a size of semiconductor chip is reduced, a package including the chip remains a certain size, improvement of productivity has hitherto been limited.

Recently, as disclosed in Japanese Unexamined Patent Publication (Kokai) No. 10-79362 (JP-A-10-79362), a semiconductor device has been proposed which can not only be fabricated by a simplified manufacturing process which combines a wafer process with a packaging process, but can also have an external chip size approximately the same as an external package size. As shown in FIG. 9, the semiconductor device of this type comprises a semiconductor chip 51 having aluminum (Al) pads (Al electrodes) 53 formed on its surface, a first insulation film 52, such as a film made of polyimide, formed so as to expose the Al pads 53, and patterned rerouting wiring lines 54 formed on the first insulation film 52 to be connected to the Al pads 53. The Al pads 53, the insulation film 52, and the rerouting wiring lines 54 are formed in a semiconductor wafer process. The first insulation film 52, such as a film of a photosensitive polyimide, is patterned through a known photolithography process to provide openings to expose the Al pads 53. The rerouting wiring lines 54 are formed by forming a film, such as a film of copper or aluminum, on the surface of the first insulation film 52 by a sputtering process, and etching the film to provide a desired pattern, or bonding a metal foil, such as a copper foil, to the surface of the insulation film 52, and etching the foil to provide a desired pattern.

A second insulation film 56 is formed on the surfaces of the first insulation film 52, and rerouting wiring lines 54, as a protective film having openings 55 exposing a portion of the rerouting wiring line 54. The openings 55 are formed in the second insulation film 56 by, for example, applying a photosensitive solder resist to cover the first insulation film 52 and rerouting wiring lines 54, and exposing and developing it. A solder ball 57, as an external connection terminal, is placed in the opening 55, and is then reflowed to be connected to the exposed portion of the rerouting wiring line 54. Alternatively, metal posts (not shown) to be subsequently jointed to external connection terminals are formed on the rerouting wiring lines 54, an encapsulating resin (not shown), such as an epoxy resin, is then applied in such a manner that the top ends of the metal posts are exposed, and solder balls are placed and reflowed at the top ends of the posts to be connected thereto.

In this way, a plurality of semiconductor devices 58 are simultaneously produced on a wafer (not shown). Subsequently, the wafer is cut into respective semiconductor chips 51, which are then subjected to functional tests to provide the semiconductor device 59 in a chip size as shown in FIG. 10.

In the semiconductor device 59 shown in FIG. 10, one patterned rerouting wiring line 54 connects one Al pad 53 formed and exposed at the periphery region of the semiconductor chip 51 with one solder ball 57 formed as an external connection terminal. For example, respective patterned rerouting wiring lines 54 in the semiconductor device of FIG. 10 are formed one by one to extend from respective address electrodes A0 to A6, a ground electrode Vss, a data electrode D for data signal transmission, controlling electrodes sending and receiving various controlling signals (specifically, WE for writing signal, RAS for reading signal, CAS for selecting signal, and CS for controlling signal), and a power supplying electrode Vcc, which are all formed as Al pads 53, to respective corresponding solder balls 57.

In the case where a semiconductor device is produced in which a plurality of semiconductor chips 51 are consolidated into one, the number of solder balls 57 formed as external connection terminals in the area of the semiconductor device which is produced in a size approximately the same as that of the consolidated semiconductor chips 51 is increased. There has been a problem that when the number of solder balls is increased and the pitch of the balls is narrowed accordingly, the formation of the rerouting wiring lies 54 separately connecting the respective Al pads 53 and the corresponding solder balls 57 provided on each of the semiconductor chip 51 is difficult. Also, in the case where such a semiconductor device is to be mounted on a substrate, the larger the number of semiconductor chips 51, the larger the number of lands on the mounting substrate to which the solder balls are connected. Consequently, there has also been a problem that the narrowed pitch of lands makes it difficult to form patterned wiring lines to be connected to the lands on the mounting substrate.

On the other hand, in the case where semiconductor devices having an individual semiconductor chip are to be separately mounted on a substrate, there has been a problem in production that mounting of the semiconductor devices to the substrate takes a lot of time.

SUMMARY OF THE INVENTION

To solve the above problems, the invention aims to provide a semiconductor device in which a plurality of semiconductor chips are consolidated into one, and which is provided with at least a set of rerouting wiring lines formed so as to interconnect electrodes of the respective semiconductor chips, the electrodes having a function which is common to the respective semiconductor chips, the set of rerouting wiring lines having a common external connection terminal.

In one aspect, the semiconductor device according to the invention comprises a plurality of semiconductor chips consolidated into one, each semiconductor chip having formed on its surface elements, a first insulation film formed so as to expose the electrodes, patterned rerouting wiring lines formed on the first insulation film to be connected to the electrodes, and a second insulation film formed to cover the first insulation film and the rerouting wiring lines in such a manner that a portion of the rerouting wiring line is exposed for connection with an external connection terminal, wherein the semiconductor device comprises at least a set of rerouting wiring lines formed so as to interconnect electrodes of the respective semiconductor chips, the electrodes having a function which is common to the respective semiconductor chips, the set of rerouting wiring lines having a common external connection terminal.

In this semiconductor device, a solder bump may be provided on the portion of the rerouting wiring line for the connection with an external connection terminal. Also, the first insulation film may be a film formed of a photosensitive polyimide, or formed from an anisotropically conductive sheet, and the second insulation film may be a film formed of a photosensitive solder resist.

In another aspect, the semiconductor device according to the invention comprises a plurality of semiconductor chips consolidated into one, each semiconductor chip having formed on its surface electrodes, an insulation film formed so as to expose the electrodes, patterned rerouting wiring lines formed on the first insulation film to be connected to the electrodes, metal posts formed to be connected to the rerouting wiring line for subsequent connection with an external connection terminal, and an encapsulation layer formed of a resin to encapsulate the insulation film, the patterned rerouting wiring lines, and the metal posts in such a manner that ends of the metal posts to be connected with the external connection terminals are exposed, wherein the semiconductor device comprises at least a set of rerouting wiring lines formed so as to interconnect electrodes of the respective semiconductor chips, the electrodes having a function which is common to the respective semiconductor chips, the set of rerouting wiring lines having a common external connection terminal.

In this semiconductor device, a solder bump may be provided on the exposed end of the metal post for the connection with an external connection terminal. Also, the insulation film may be a film formed of a photosensitive polyimide, and the metal post may be formed to be deposited or built upon the face of the rerouting wiring line by electrolytic copper plating.

In a further aspect, the semiconductor device according to the invention comprises a plurality of semiconductor chips consolidated into one, each semiconductor chip having electrodes formed on its surface, a first insulation film formed so as to expose the electrodes, patterned rerouting wiring lines formed on the first insulation film to be connected to the electrodes, external connection terminals formed by connecting a wire to the rerouting wiring line in such a manner that the wire stands up from the face of the rerouting wiring line, and a second insulation film formed to cover the first insulation film, the rerouting wiring lines, and the wires in such a manner that free ends of the wires of external connection terminals are exposed, wherein the semiconductor device comprises at least a set of rerouting wiring lines formed so as to interconnect electrodes of the respective semiconductor chips, the electrodes having a function which is common to the respective semiconductor chips, the set of rerouting wiring lines having a common external connection terminal.

In this semiconductor device, the external connection terminal may be formed by bonding a gold wire to the rerouting wiring line, and cutting and bending the wire to provide a terminal having intermediate L-like bends and an end which is generally perpendicular to the face of the semiconductor chip. Also, the first insulation film may be a film formed of a photosensitive polyimide, or formed from an anisotropically conductive sheet, and the second insulation film may be a film formed of a photosensitive solder resist.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein:

FIG. 5 schematically shows a still further embodiment of the semiconductor device of the invention;

DETAILED DESCRIPTION OF THE INVENTION

Figure 1:
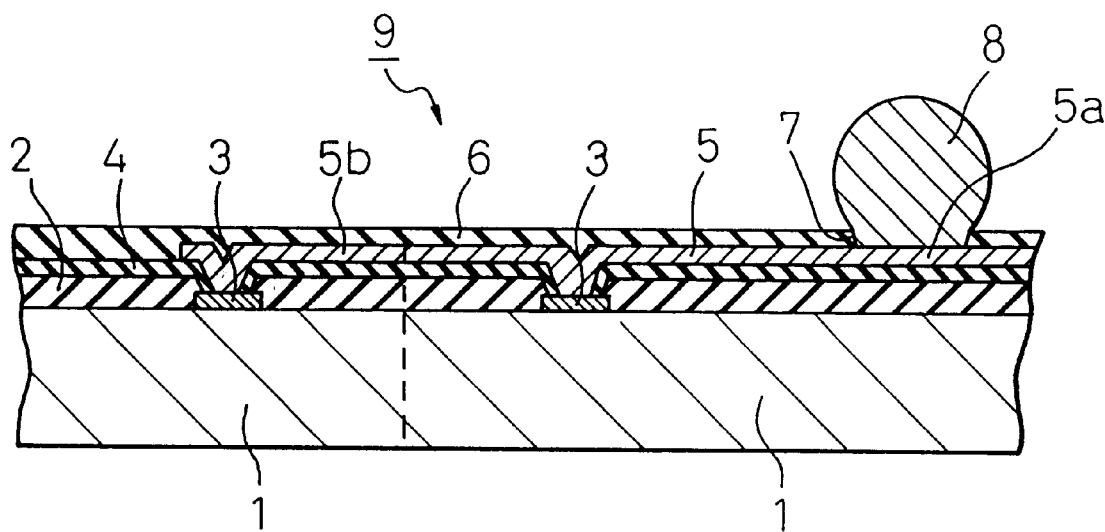
FIG. 1 schematically illustrates an embodiment of the semiconductor device of the invention.

FIG. 1 schematically illustrates a semiconductor device 9 of the invention, which comprises semiconductor chips 1, a passivation film 2 made of SiN or the like, and Al pads 3 which are electrodes formed on the semiconductor chips 1. The passivation film 2 is formed so as to expose the top of the Al pad 3. A number of Al pads 3 are formed on the semiconductor chip 1 in a desired pattern.

A first insulation film 4 is formed of a material such as a photosensitive or non-photosensitive polyimide resin, to cover the passivation film 2 and expose the top of Al pads 3.

Rerouting wiring lines 5 are formed, in a desired pattern, on the first insulation film 4 to be electrically connected to the Al pads 3. The rerouting wiring lines 5 are made by, for example, forming a Cu or an Al film on the first insulation film 4 and the Al pads 3 by a sputtering process, and then patterning the film by etching. A pattern of the rerouting wiring lines may be formed by etching a metal foil, such as a copper foil, placed on the film 4 and the Al pads 3.

A second insulation film 6 is formed to cover the first insulation film 4 and the patterned rerouting wiring lines 5. The second insulation film 6 is a protective film, and may be formed of a photosensitive insulating material, such as a photosensitive polyimide or photosensitive solder resist, or an insulating resin, such as a epoxy-based or silicon-based resin.

Openings or holes 7 are formed in the second insulation film 6 at the locations corresponding to an appropriate portion of the underlying patterned rerouting wiring line 5, to have a certain arrangement such as a matrix-like arrangement. The portion of rerouting wiring line 5 exposed by the opening 7 becomes a connecting portion 5a of the rerouting wiring line 5 for the connection with an external connection terminal.

Metal bumps 8, which are external connection terminals, are formed to be electrically connected to the respective connecting portions 5a of the rerouting wiring lines 5 through the respective openings 7, and project above the second insulation film 6.

The metal bump 8 of external connection terminal may be formed as a ball bump as illustrated in FIG. 1, or may be formed to have another shape, such as a land-like shape having a flat top face. The external connection terminal may be a lead pin (not shown) bonded to the connecting portion 5a, instead of the metal bump 8.

The semiconductor device 9 of the invention is thus produced to have two or more semiconductor chips 1 consolidated into one, without being separated to the individual chips.

The first and second insulation films 4 and 6, which represent interposers, can be formed as thin films and, accordingly, the semiconductor device 9 can be made very thin. Also, the first and second insulation films have a not very high hardness and, accordingly, may serve as a buffer layer for buffering a stress occurring between the semiconductor chip 1 and a mounting substrate (not shown) and protecting the surface of the semiconductor chip 1.

Figure 2:
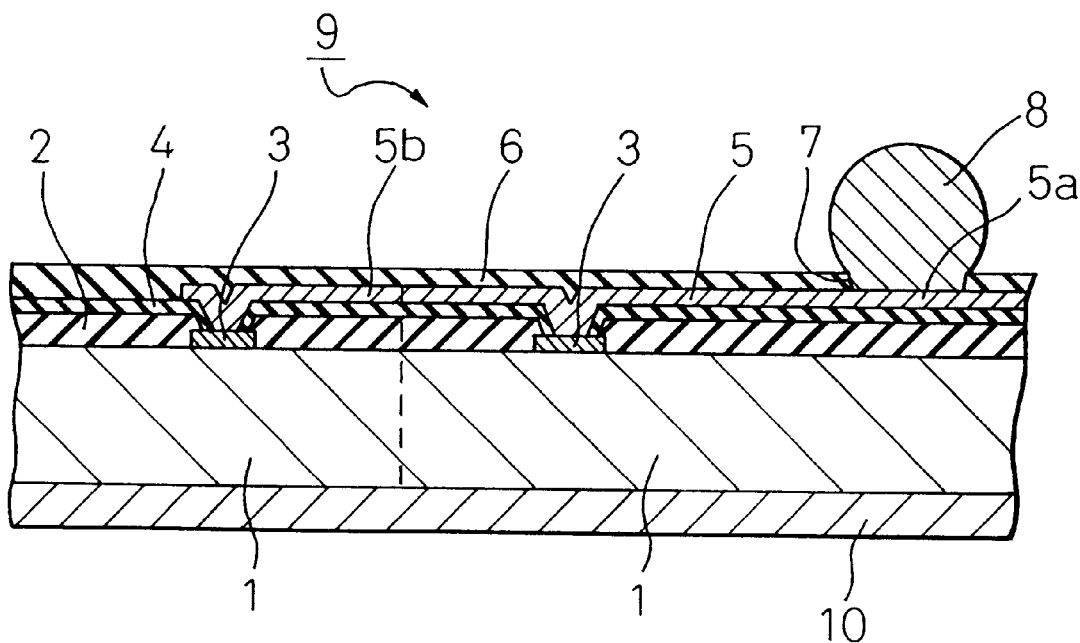
FIG. 2 schematically shows a modification of the embodiment of FIG. 1.

It is preferred that the side (back side) of the semiconductor chip 1 opposite to the side on which the Al pads 3 are formed is exposed to enhance heat-dissipating properties. To further improve heating-dissipating properties, a heat-dissipating device, such as a heat-spreader 10 attached to the back side as illustrated in FIG. 2, may be used.

Figure 3:
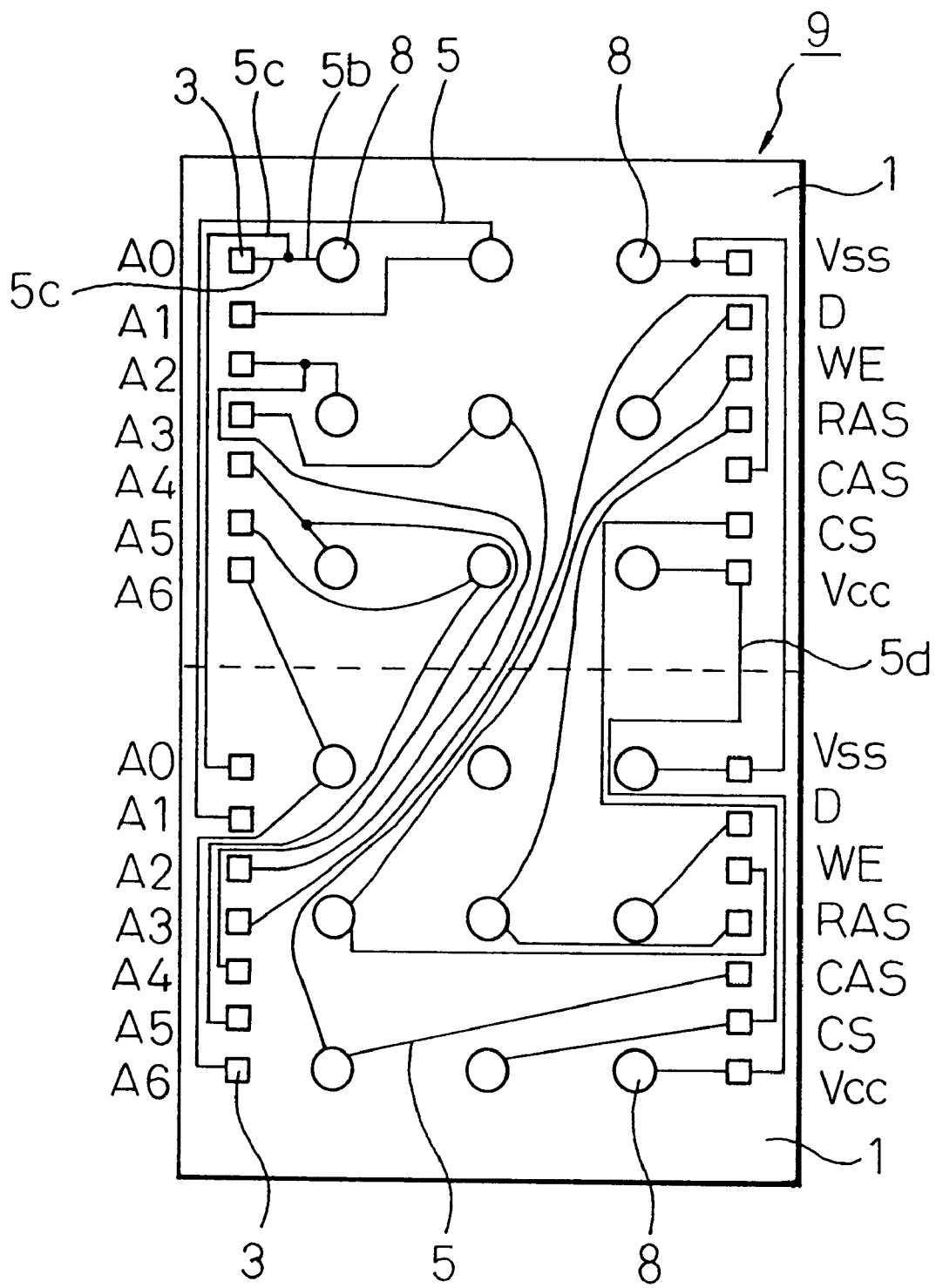
FIG. 3 is a plan view showing an example of rerouting wiring lines between electrodes and external connection terminals of a semiconductor device of the invention.

Referring to FIG. 3, an embodiment of patterned rerouting wiring lines 5 connecting the Al pads 3 with the metal bumps 8 formed in the semiconductor device 9 is illustrated. In this embodiment, the semiconductor device 9 has two chips 1, which are not separated and are consolidated into one.

For Al pads 3 of the respective chips 1 having the same function, a set of rerouting wiring lines 5 is provided. The Al pads 3 in the semiconductor device 9 having the same function may be interconnected in any way using the set of rerouting wiring lines 5. For example, the set of rerouting wiring lines 5 may have a common portion 5b connection to a common metal bump 8, and portions 5c connected to respective pads 3. Thus, in the semiconductor device 9 of FIG. 3, some of the metal bumps 8 are respectively used in common by the Al pads 3 having the same function, and each of such metal bumps 8 is connected with the respective Al pads 3 having the same function through a set of rerouting wiring lines which includes the common wiring line 5b connected with the bump 8 and the respective wiring lines 5c exclusively used for the connection with the respective pads 3. Alternatively, the respective pads 3 may be separately connected with the bump 8.

More specifically, each semiconductor chip 1 of FIG. 3 has, as the Al pads 3, the following 14 electrodes: address electrodes A0 to A6, a grounding electrode Vss, a data electrode D for data signal, controlling electrodes sending and receiving various controlling signals (an electrode WE for writing signal, an electrode RAS for reading signal, an electrode CAS for selecting signal, and an electrode CS for controlling signal), and a power supplying electrode Vcc, in its peripheral region. The semiconductor device 9 having two unseparated semiconductor chips 1 has the metal bumps 8, the total number of which is smaller than that of the Al pads 3 of the two chips 1. In other words, a common metal bump 8 is provided for each set of the address electrodes A0 to A6, the writing signal electrodes WE, the reading signal electrodes RAS, the selecting signal electrodes CAS, and the controlling signal electrodes CAS of the two unseparated chips 1, to thereby reduce the number of bumps therefor. On the other hand, for each set of the grounding electrodes Vss and the power supplying electrodes Vcc of the respective semiconductor chips 1, a common rerouting wiring line 5d is formed between the electrodes Vss or the electrodes Vcc of the respective chips 1, and the respective electrodes Vss or Vcc are separately connected with the respective metal bumps 8.

In the semiconductor device 9 according to the invention, which has two or more consolidated semiconductor chips 1, the number of metal bumps 8 to which Al pads 3 provided in each semiconductor chip 1 are to be connected can be reduced as much as possible by use of a common metal bump 8 for each set of Al pads 3 having the same function and, consequently, spaces for the formation of the rerouting wiring lines 5 connecting the Al pad 3 with the metal bump 8 can be sufficiently secured in the semiconductor device 9. Also, pitches between lands on a substrate, on which the semiconductor device 9 is to be mounted, can be widened and, consequently, a semiconductor device comprising a plurality of semiconductor chips consolidated into one can be produced and mounted on a substrate, which has been difficult hitherto. Accordingly, an area for mounting the semiconductor device 9 on a substrate can also be remarkably reduced, to thereby contribute to miniaturization of mounting substrates. In addition, it is possible to mount the semiconductor device 9 having a plurality of consolidated semiconductor chips 1 on a substrate by one mounting operation and, accordingly, the efficiency of the mounting operation can be enhanced.

Figure 4:
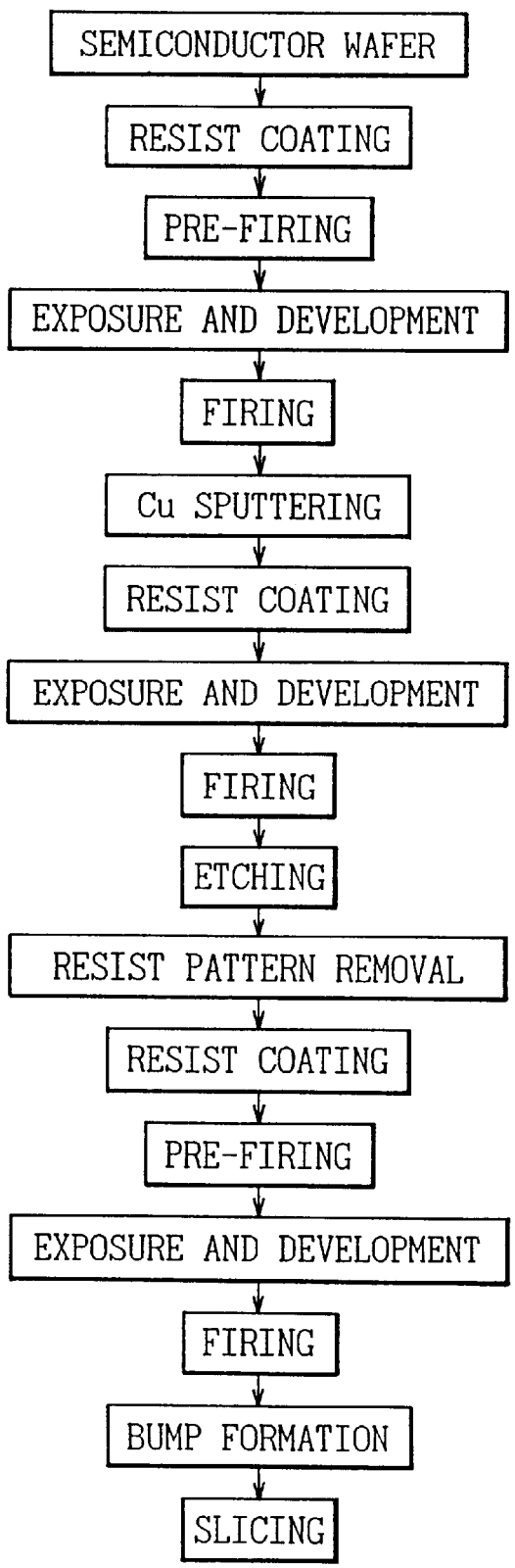
FIG. 4 is a block diagram showing a manufacturing process of a semiconductor device of the invention.

Referring to FIG. 1 and a flow diagram shown in FIG. 4, a process for the manufacture of the semiconductor device 9 is described.

First, a photosensitive resist (for example, a photosensitive polyimide) is applied onto a single semiconductor wafer having a number of semiconductor chips 1, on which patterned wiring lines (not shown) of metal, such as Al, and Al pads 3 are formed in advance, and a passivation film 2 is formed to expose the top of the Al pads 3.

Subsequently, the photosensitive resist is pre-fired, and is then exposed and developed through a known photolithography process to thereby be partially removed at the locations corresponding to the Al pads 3, and is further fired to form a first insulation film 4 having openings or holes 6 to expose the top of the Al pads 3.

A film of copper is then formed on the first insulation film 4 and the exposed Al pads 3 by sputtering. The copper film may be formed by another process such as evaporation. The copper film is formed to provide a conductor layer for the formation of a pattern of rerouting wiring lines. The copper film may be replaced with a film of another material such as aluminum. The copper film can be additionally copper-plated to provide the resultant rerouting lines with a better electrical conductivity.

A photosensitive resist is applied onto the copper film, and is then exposed, developed, and fired to form a resist pattern. Using the resist pattern as a mask, the copper film is etched to form the patterned rerouting wiring lines 5. The resist pattern is then peeled-off and removed.

Subsequently, to form a second insulation film 6 as a protective film having openings 7 for metal bumps, a photosensitive resist (photosensitive solder resist) is applied onto the first insulation film 4 and the rerouting wiring lines 5, and is then pre-fired, exposed, developed, and finally fired.

A solder ball is placed inside the opening 7, and is then reflowed to be electrically connected to the connecting portion 5a of the rerouting wiring line 5 to formed an external connection terminal (metal bump 8). The bump 8 may be formed by plating the connecting portion 5a of the rerouting wiring line 5 with nickel (Ni) and gold (Au), to form a Ni-Au bump.

The water processed as described above is sliced to provide the semiconductor device 9 having a plurality of semiconductor chips 1 (for example, two semiconductor chips) consolidated into one. Side walls of the semiconductor device 9 can be coated with a resist, and it is dried to form a protective film, as required.

Thus, the semiconductor device 9 having a plurality of consolidated semiconductor chips 1 can enhance its productivity and can reduce its production cost.

Although the production of semiconductor device 9 having two semiconductor chips 1 consolidated therein has been described, the semiconductor device of the invention is not limited thereto. It is possible that the semiconductor device of the invention has, for example, four semiconductor chips consolidated into one, in which a common metal bump and an accompanied set of rerouting wiring lines are used by Al pads, of respective chips, having the same function.

It is preferred that, as the consolidated semiconductor chips 1 in the semiconductor device 9 of the invention, an MPU and a cache memory is used in combination, or a plurality of memories are used in combination.

When a semiconductor device is to be produced using a plurality of memories, rerouting wiring lines are formed on a semiconductor wafer, and the wafer is finally cut into individual semiconductor devices having a plurality of chips (memories) consolidated therein. When different types of semiconductor chips, such as an MPU and a cache memory, are combined in a semiconductor device of the invention, the different types of semiconductor chips are arranged adjacent to each other to provide a consolidated body, and rerouting wiring lines are formed on the consolidated body.

Figure 5:
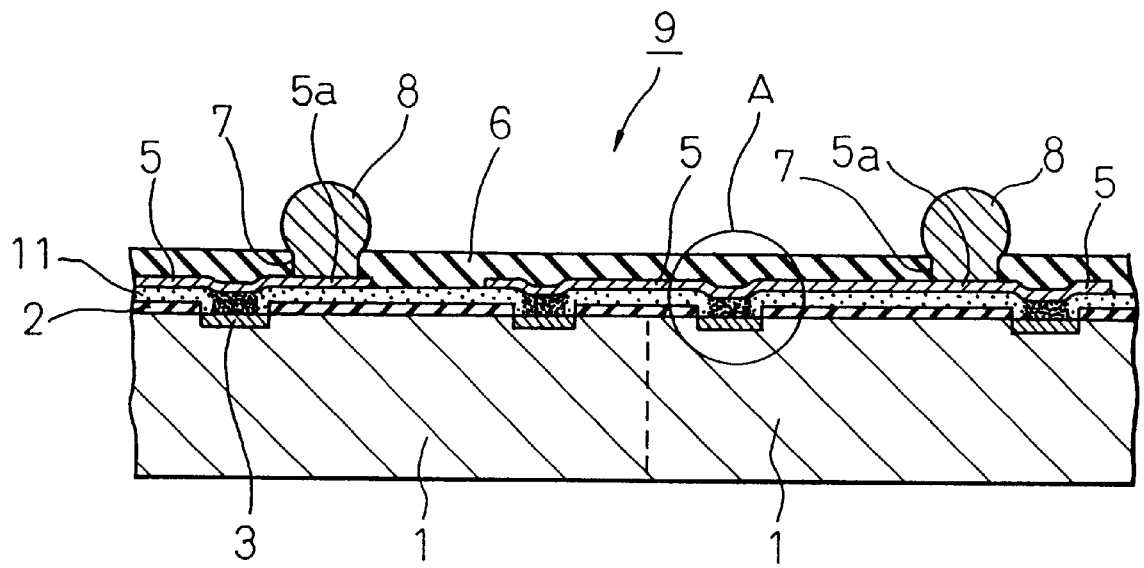
FIG. 5 is a schematical view of another embodiment of the semiconductor device of the invention.
Figure 6:
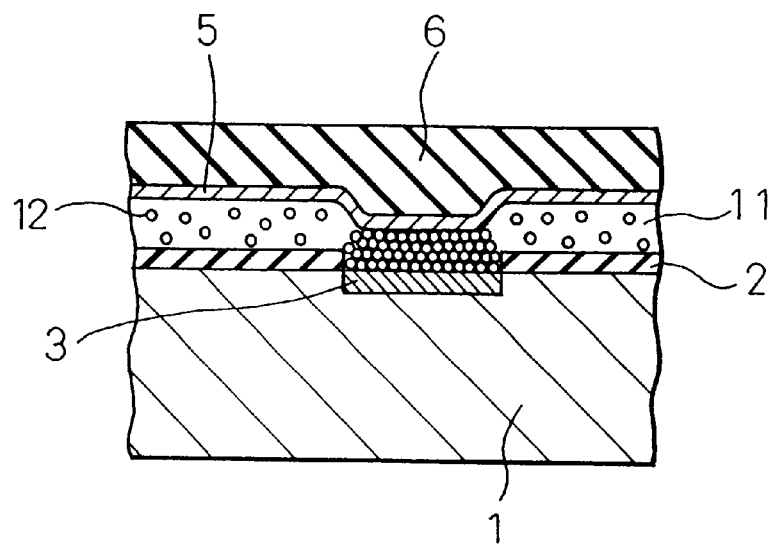
FIG. 6 is an enlarged view of part indicated by A of the semiconductor device of FIG. 5.

Referring to FIGS. 5 and 6, another embodiment of the semiconductor device of the invention is described. In these drawings, members which are the same as those in the former embodiment are indicated by the same numbers.

FIG. 5 shows semiconductor chips 1 provided on their surface with a number of Al pads 3 of electrodes formed in a desired pattern, and with a passivation film 2 of SiN or the like formed on the semiconductor chips 1 so as to expose the tops of the Al pads 3.

A first insulation film 11, which results from an anisotropically conductive sheet in this embodiment, is provided to cover the passivation film 2 and expose the top of the Al pads 3. The anisotropically conductive sheet is made of a resin filled with conductive filler 12 (FIG. 6), such as metal powder. By pressing, the conductive fillers 12 are successively connected in the direction of the pressing, to thereby display electrical conductivity in that direction and electrically connect a rerouting wiring line 5 located thereon with the Al pads 3.

The rerouting wiring lines 5 are formed on the first insulation film (anisotropically conductive sheet) 11 in a desired pattern. The rerouting wiring line 5 is pressed so as to be intruded into the anisotropically conductive sheet, as shown in FIG. 6, and the anisotropically conductive sheet becomes electrically conductive at the pressed site, to thereby electrically connect the Al pad 3 with the rerouting wiring line 5, as described above.

The patterned rerouting wiring lines 5 may be formed by applying a metal foil, such as a copper foil, onto the first insulation film 11, and etching the metal foil to provide a desired pattern, or by forming a film of metal, such as copper or aluminum, by a sputtering process or the like, and etching the film to provide a desired pattern. Like the former embodiment, for Al pads 3 of the respective unseparated chips 1 having the same function, a set of rerouting wiring lines 5 is provided to connect the Al pads 3 having the same function with a single common metal bump 8.

The surfaces of the first insulation film (anisotropically conductive sheet) 11 and the rerouting wiring lines 5 are covered by a second insulation film 6. The second insulation film 6 is a protective film, and is formed of a photosensitive insulating material, such as a photosensitive polyimide or a photosensitive solder resist, or an insulating resin, such as an epoxy- or a silicon-based insulating resin.

Openings or holes 7 are formed in the second insulation film 6 at the locations corresponding to appropriate portions of the patterned rerouting wiring line 5, to have a certain arrangement such as a matrix-like arrangement, and, through the openings or holes 7, the portions of the rerouting wiring line 5 are exposed. A metal bump 8 is located on the exposed portion of the rerouting wring line 5, which is formed by reflowing a metal ball placed on that portion to be electrically connected to the rerouting wiring line 5, and projects above the second insulation film 6.

The metal bump 8 of external connection terminal may be formed as a ball bump of, for example, a solder, as illustrated in FIG. 5, or may be formed to have another shape, such as a land-like shape having a flat top face. The external connection terminal may be a lead pin (not shown) bonded to the connecting potion 5a, instead of the metal bump 8. Alternatively, the bump 8 may be formed of a plated material, such as plated nickel-gold material.

The semiconductor device 9 of this embodiment is thus produced to have two or more semiconductor chips 1 consolidated into one. The first insulation film (anisotropically conductive sheet) 11 and the second insulation film (photosensitive resist film) 6, which represent interposers, can be formed as thin films and, accordingly, the semiconductor device 9 can be made very thin.

The first and second insulation films 11 and 6 have a now very high hardness and, accordingly, may serve as a buffer layer for buffering a stress occurring between the semiconductor chip 1 and a mounting substrate (not shown) and protecting the surface of the semiconductor chip 1.

It is preferred that the side (back side) of the semiconductor chip 1 opposite to the side on which the Al pads 3 are formed is exposed to enhance heat-dissipating properties. To further improve heat-dissipating properties, a heat-dissipating deice, such as a heat-spreader (not shown), may be attached to the back side.

Figure 7:
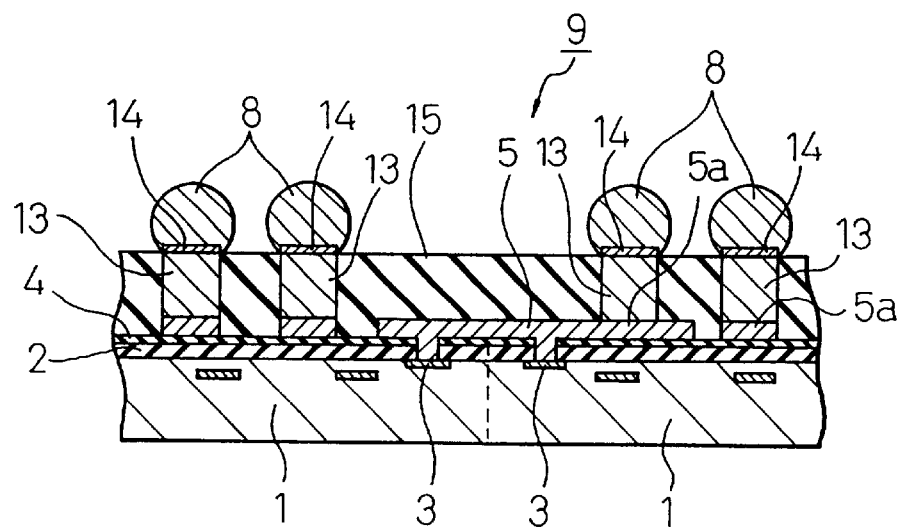
FIG. 7 schematically shows a further embodiment of the semiconductor device of the invention.

Referring to FIG. 7, a further embodiment of the semiconductor device of the invention is described. In the drawing, members which are the same as those in the former embodiments are identified by the same number.

FIG. 7 shows semiconductor chips 1 provided on their surface with a number of Al pads 3 of electrodes formed in a desired pattern, and with a passivation film 2 of SiN or the like formed on the semiconductor chips 1 to expose the top of the Al pads 3.

An insulation film 4 is formed of a resin, such as a photosensitive or non-photosensitive polyimide resin, to cover the passivation film 2 and expose the top of the Al pads 3.

Patterned rerouting wiring lines 5 are formed on the insulation film 4 to be connected to the Al pads 3.

Specifically, a thin metallic film is formed on the insulation film 4 by successively depositing a contacting metal layer (for example, Ti or Cr layer) and a copper layer by sputtering. After the metal film is patterned with a resist, rerouting wiring lies 5 are formed by electrolytic copper plating. Alternatively, the patterned rerouting wiring lines 5 may be formed by applying a metal foil, such as a copper foil, onto the insulation film 4, and patterning the metal foil by etching. Like the former embodiments, for Al pads 3 of the respective unseparated chips 1 having the same function, a set of rerouting wiring lines 5 is provided to connect the Al pads 3 having the same function with a single common metal bump 8.

A metal post 13 is formed on the patterned rerouting wiring line 5 for the connection with an external connection terminal. The metal post 13 is formed by use of a resist, for patterning, and deposition of copper, by electrolytic plating, to form a column-like deposit. A barrier metal layer 14 of, for example, Ni or Au, is formed on the top end of the metal post 13 by electrolytic plating. The insulation film 4, rerouting wiring lines 5, and metal post 13 are then encapsulated by an encapsulating resin, such as an epoxy resin, in such a manner that the barrier metal layers 14 on the top ends of the barrier metal layers 14 are exposed. Subsequently, a metal ball is placed on the barrier metal layer 14, and is reflowed to provide a metal bump 8 of external connection terminal. The metal bump 8 may be formed as a ball bump as illustrated in the drawing, or may be formed to have another shape, such as a land-like shape having a flat top face. The external connection terminal may be a lead pin (not shown) electrically connected to the post 13, instead of the metal bump 8.

Figure 8:
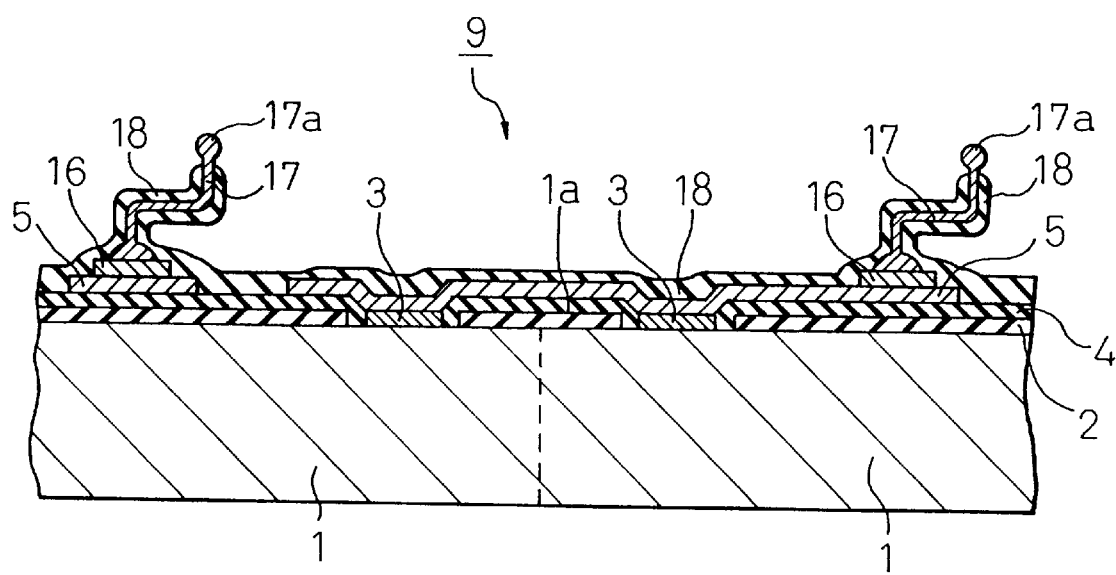
Figure 9:
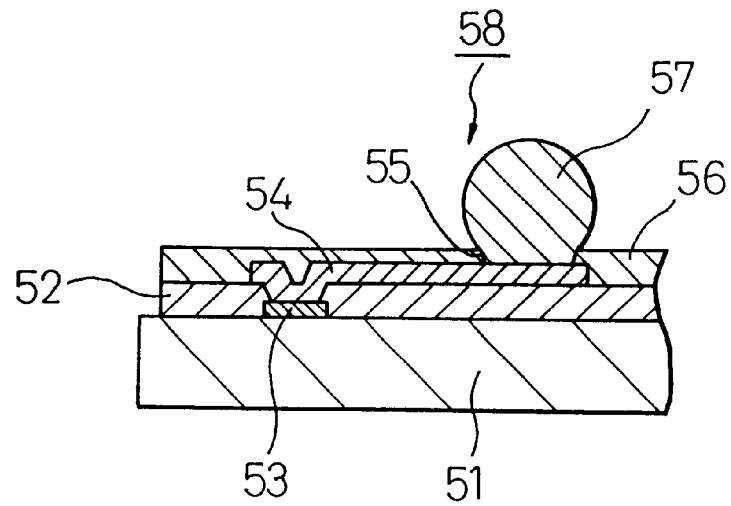
FIG. 9 schematically illustrates a semiconductor device.
Figure 10:
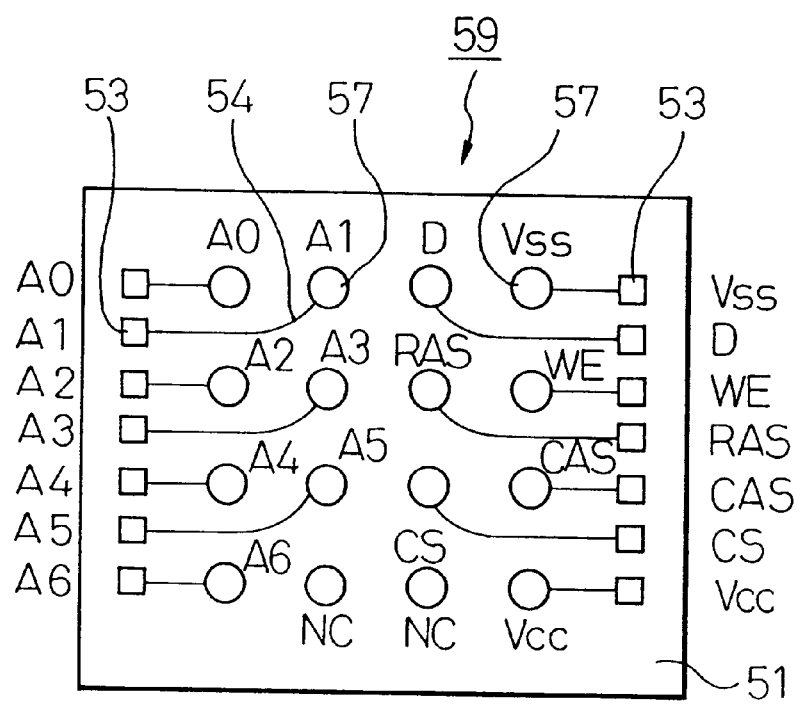
FIG. 10 is a plan view showing an example of rerouting wiring lines between electrodes and external connection terminals of a conventional semiconductor device.

Referring to FIG. 8, a further embodiment of the semiconductor device of the invention is described. In the drawing, members which are the same as those in the former embodiments are identified by the same number used in the former embodiments.

In the semiconductor device of FIG. 8, Al pads 3, which are electrodes, and a passivation film 2 made of a material such as SiN are formed on a semiconductor chip 1 in such a manner that the top of the Al pads 3 are exposed. The Al pads 3 are arranged on the semiconductor chip 1 in a desired pattern.

An first insulation film 4 is formed on the passivation film 2 using a photosensitive or non-photosensitive polyimide or the like so as to expose the top of the Al pads 3.

Patterned rerouting wiring lines 5 are formed on the first insulation film 4 to be connected to the Al pads 3. Specifically, a thin metallic film (not shown) is formed on the first insulation film 4 by successively depositing a contacting metal layer (for example, Ti or Cr layer) and a copper layer by sputtering. After the metal film is patterned using a resist, rerouting wiring lines 5 are formed on the film by electrolytic copper plating. Alternatively, the patterned rerouting wiring lines 5 may be formed by applying a metal foil, such as a copper foil, onto the insulation film 4, and patterning the metal foil by etching. Like the former embodiments, for Al pads 3 of the respective unseparated chips 1 having the same function, a set of rerouting wiring lines 5 is provided to connect the Al pads 3 having the same function with a single common metal bump 8.

A connecting pad 16 is formed on a portion of the rerouting wiring line 5, and a wire-like external connection terminal 17 is connected to the connecting pad 16 by a wire bonding technique. For example, the external connection terminal 17 is formed by bonding a gold wire to the connecting pad 16 using a bonding tool (not shown), and controlling the bonding tool to cut the wire and provide a terminal having intermediate L-like bends and an end 17a which is generally perpendicular to the electrode terminal-formed face 1a of the semiconductor chip 1, as illustrated in FIG. 8.

The surfaces of the first insulation film 4 having the patterned rerouting wiring lines 5 formed thereon, and the external connection terminals 17, are covered by a second insulation film 18. The second insulation film 18 is formed by dipping the face of the semiconductor chip 1, on which the electrodes 3 and terminals 17 are formed, in a liquid insulating resin to thereby coat, with the resin, the surfaces of the first insulation film 4 having the patterned rerouting wiring lines 5 formed thereon and the external connection terminals 17. Alternatively, the second insulation film 18 may be formed by spraying a liquid insulating resin to the surfaces of the first insulation film 4 having the patterned rerouting wiring lines 5 formed thereon and the external connection terminals 17 to coat them. A liquid insulating resin may be spin-coated on the face of the semiconductor chip 1 on which the electrodes 3 and terminals 17 are formed thereon, to thereby coat the face of the chip 1 and the surface of the external connection terminals with the resin. The insulating resin may be an epoxy or polyimide resin, for example.

The coated insulating resin on the surfaces of the first insulation film 4 having the patterned rerouting wiring lines 5 formed thereon and the external connection terminals 17 is then post-cured. In this condition, the ends 17a of the external connection terminals 17 are covered by the cured resin, and are then exposed by, for example, dipping only the ends 17a of the terminals 17 in a removing solution to thereby dissolving the resin on the ends 17a of the terminal 17. Alternatively, the second insulation film 18 may be formed by coating, with a resin, the surfaces of the first insulation film 4 having the patterned rerouting wiring lines 5 formed and the external connection terminals 17, provisionally curing the resin, dissolving and removing the resin on the end 17a of the terminal 17, and the finally curing the remaining resin to provide the second insulation film 18. Use of a provisionally cured resin has an advantage that it can be easily dissolved and removed.

By covering the electrode-formed face of the chip 1 and the surfaces of the external connection terminals 17 with the second insulation film 18, the external connection terminals 17 are reinforcedly supported. An insulating resin forming such a film has certain flexibility, and can provide an external connection terminal having desired elasticity.

The external connection terminal 17 thus covered by an insulating resin except for its end 17a can be protected from electrical short-circuit resulted from a portion of the terminal 17 other than its end 17a being directly coated with a solder during the mounting of the semiconductor device 9 on a substrate. By controlling an area of the end 17a exposed, its wettability to a solder during the mounting of the semiconductor device 9 to a substrate can be controlled. Covering the surface of the external connection terminal 17 except for its end 17a with an insulating resin prevents a solder wetting portions of the terminal 17 other than its end 17a, for example.

As described, in the semiconductor device according to the invention, which has two or more semiconductor chips consolidated into one, the number of metal bumps to which Al pads provided in each semiconductor chip are to be connected can be reduced as much as possible by use of a common metal bump for each set of Al pads having the same function and, consequently, spaces for the formation of the rerouting wiring lines connecting the Al pad with metal bump can be sufficiently secured in the semiconductor device. Also, pitches between lands on a substrate on which the semiconductor device is to be mounted can be widened and, consequently, a semiconductor device having a plurality of consolidated semiconductor chips can be produced and mounted on a substrate, which has been difficult hitherto. Accordingly, an area for mounting the semiconductor device can also be remarkably reduced, to thereby contribute to miniaturization of mounting substrates. In addition, it is possible to mount the semiconductor device having a plurality of semiconductor chips consolidated into one on a substrate by one mounting operation and, accordingly, efficiency in the mounting operation can be enhanced.

Although the preferred embodiments of the invention have been described, the invention is not limited to such embodiments, and it should be appreciated that various changes and modifications may be made without departing from the spirit and scope of the invention.

What is claimed is:

1. A semiconductor device comprising a plurality of semiconductor chips consolidated into one, each semiconductor chip having formed on its surface electrodes, a first insulation film formed so as to expose the electrodes, patterned rerouting wiring lines formed on the first insulation film to be connected to the electrodes, and a second insulation film formed to cover the first insulation film and the rerouting wiring lines in such a manner that a portion of the rerouting wiring line is exposed for connection with an external connection terminal, wherein the semiconductor device comprises at least a set of rerouting wiring lines formed so as to interconnect electrodes of the respective semiconductor chips, the electrodes having a function which is common to the respective semiconductor chips, the set of rerouting wiring line having a common external connection terminal.

2. The semiconductor device of claim 1, wherein metal bumps are connected to the respective exposed portions of the rerouting wiring lines.

3. The semiconductor device of claim 1, wherein the first insulation film is a film formed of a photosensitive material.

4. The semiconductor device of claim 3, wherein the photosensitive material is a photosensitive polyimide.

5. The semiconductor device of claim 1, wherein the first insulation film is formed from an anisotropically conductive sheet, and each of the electrodes is electrically connected to the rerouting wiring line through the anisotropically conductive sheet.

6. The semiconductor device of claim 1, wherein the second insulation film is formed of a photosensitive solder resist.

7. The semiconductor device comprising a plurality of semiconductor chips consolidated into one, each semiconductor chip having formed on its surface electrodes, an insulation film formed so as to expose the electrodes, patterned rerouting wiring lines formed on the first insulation film to be connected to the electrodes, metal posts formed to be connected to the rerouting wiring line for subsequent connection with an external connection terminal, and an encapsulation layer formed of a resin to encapsulate the insulation film, the patterned rerouting wiring lines, and the metal posts in such a manner that ends of the metal posts to be connected with the external connection terminals are exposed, wherein the semiconductor device comprises at least a set of rerouting wiring lines formed so as to interconnect electrodes of the respective semiconductor chips, the electrodes having a function which is common to the respective semiconductor chips, the set of rerouting wiring line having a common external connection terminal.

8. The semiconductor device of claim 7, wherein metal bumps are connected to the respective exposed ends of the metal posts.

9. The semiconductor device of claim 7, wherein the first insulation film is a film formed of a photosensitive material.

10. The semiconductor device of claim 9, wherein photosensitive material is a photosensitive polyimide.

11. The semiconductor device of claim 7, wherein the second insulation film is formed of a photosensitive solder resist.

12. The semiconductor device of claim 7, wherein the metal posts are formed by depositing or building up a metalic material on the respective exposed rerouting wiring lines by electrolytic plating.

13. A semiconductor device comprising a plurality of semiconductor chips consolidated into one, each semiconductor chip having formed on its surface electrodes, a first insulation film formed so as to expose the electrodes, patterned rerouting wiring lines formed on the first insulation film to be connected to the electrodes, external connection terminals formed by connecting a wire to the rerouting wiring line in such a manner that the wire stands up from the face of the rerouting wiring line, and a second insulation film formed to cover the first insulation film, the rerouting wiring lines, and the wires in such a manner that free ends of the wires of external connection terminals are exposed, wherein the semiconductor device comprises at least a set of rerouting wiring lines formed so as to interconnected electrodes of the respective semiconductor chips, the electrodes having a function which is common to the respective semiconductor chips, the set of rerouting wiring line having a common external connection terminal.

14. The semiconductor device of claim 13, wherein the wires of external connection terminals has intermediate L-shaped bends and an end which is generally perpendicular to the face of the semiconductor chip.

15. The semiconductor device of claim 13, wherein the wire of the external connection terminals is made of gold.

16. The semiconductor device of claim 13, wherein the first insulation film is a film formed of a photosensitive material.

17. The semiconductor device of claim 16, wherein the photosensitive material is a photosensitive polyimide.

18. The semiconductor device of claim 13, wherein the first insulation film is formed from an anisotropically conductive sheet, and each of the electrodes is electrically connected to the rerouting wiring lines through the anisotropically conductive sheet.

19. The semiconductor device of claim 13, wherein the second insulation film is formed of a photosensitive solder resist.

* * * * *